(12) United States Patent
Street et al.

(10) Patent No.: US 7,498,606 B2
(45) Date of Patent: Mar. 3, 2009

(54) MICROELECTRONIC IMAGING UNITS AND METHODS OF MANUFACTURING MICROELECTRONIC IMAGING UNITS

(75) Inventors: Bret K. Street, Meridian, ID (US); Frank L. Hall, Boise, ID (US); James M. Derderian, Boise, ID (US)

(73) Assignee: Micron Technology, Inc., Boise, ID (US)

(*) Notice: Subject to any disclaimer, the term of this patent is extended or adjusted under 35 U.S.C. 154(b) by 225 days.

(21) Appl. No.: 11/444,404

(22) Filed: Jun. 1, 2006

(65) Prior Publication Data

US 2006/0216850 A1 Sep. 28, 2006

Related U.S. Application Data

(62) Division of application No. 10/915,180, filed on Aug. 10, 2004, now Pat. No. 7,364,934.

(51) Int. Cl.
*H01L 27/15* (2006.01)
*H01L 31/12* (2006.01)
*H01L 33/00* (2006.01)

(52) U.S. Cl. .................. 257/79; 257/433; 257/434; 438/61; 438/66

(58) Field of Classification Search .............. 257/79, 257/433, 434, 723; 438/61, 66
See application file for complete search history.

(56) References Cited

U.S. PATENT DOCUMENTS

| | | | |
|---|---|---|---|
| 3,345,134 A | 10/1967 | Heymer et al. |
| 4,534,100 A | 8/1985 | Lane |
| 4,906,314 A | 3/1990 | Farnworth et al. |
| 5,130,783 A | 7/1992 | McLellan |
| 5,302,778 A | 4/1994 | Maurinus |
| 5,371,397 A | 12/1994 | Maegawa et al. |

(Continued)

FOREIGN PATENT DOCUMENTS

EP 0 886 323 12/1998

(Continued)

OTHER PUBLICATIONS

U.S. Appl. No. 10/927,550, filed Aug. 26, 2004, Derderian et al.

(Continued)

*Primary Examiner*—Phuc T Dang
(74) *Attorney, Agent, or Firm*—Dickstein Shapiro LLP

(57) ABSTRACT

Methods for manufacturing microelectronic imaging units and microelectronic imaging units that are formed using such methods are disclosed herein. In one embodiment, a method for manufacturing a plurality of microelectronic imaging units includes placing a plurality of singulated imaging dies on a support member. The individual imaging dies include a first height, an image sensor, an integrated circuit operably coupled to the image sensor, and a plurality of external contacts operably coupled to the integrated circuit. The method further includes electrically connecting the external contacts of the imaging dies to corresponding terminals on the support member and forming a base on the support member between adjacent imaging dies. The base has a second height less than or approximately equal to the first height of the dies. The method further includes attaching a plurality of covers to the base so that the covers are positioned over corresponding image sensors.

25 Claims, 8 Drawing Sheets

U.S. PATENT DOCUMENTS

| | | | |
|---|---|---|---|
| 5,424,573 A | 6/1995 | Kato et al. |
| 5,435,887 A | 7/1995 | Rothschild et al. |
| 5,505,804 A | 4/1996 | Mizuguchi et al. |
| 5,593,913 A | 1/1997 | Aoki |
| 5,605,783 A | 2/1997 | Revelli et al. |
| 5,672,519 A | 9/1997 | Song et al. |
| 5,694,246 A | 12/1997 | Aoyama et al. |
| 5,708,293 A | 1/1998 | Ochi et al. |
| 5,771,158 A | 6/1998 | Yamagishi et al. |
| 5,776,824 A | 7/1998 | Farnworth et al. |
| 5,811,799 A | 9/1998 | Wu |
| 5,821,532 A | 10/1998 | Beaman et al. |
| 5,857,963 A | 1/1999 | Pelchy et al. |
| 5,861,654 A | 1/1999 | Johnson |
| 5,877,040 A | 3/1999 | Park et al. |
| 5,897,338 A | 4/1999 | Kaldenberg |
| 5,914,488 A | 6/1999 | Sone |
| 5,977,535 A | 11/1999 | Rostoker |
| 5,998,862 A | 12/1999 | Yamanaka |
| 6,080,291 A | 6/2000 | Woodruff et al. |
| 6,104,086 A | 8/2000 | Ichikawa et al. |
| 6,114,240 A | 9/2000 | Akram et al. |
| 6,143,588 A | 11/2000 | Glenn |
| 6,236,046 B1 | 5/2001 | Watabe et al. |
| 6,259,083 B1 | 7/2001 | Kimura |
| 6,266,197 B1 | 7/2001 | Glenn et al. |
| 6,274,927 B1 | 8/2001 | Glenn |
| 6,285,064 B1 | 9/2001 | Foster |
| 6,351,027 B1 | 2/2002 | Giboney et al. |
| 6,368,899 B1 | 4/2002 | Featherby et al. |
| 6,372,548 B2 | 4/2002 | Bessho et al. |
| 6,379,988 B1 | 4/2002 | Peterson et al. |
| 6,407,381 B1 | 6/2002 | Glenn et al. |
| 6,411,439 B2 | 6/2002 | Nishikawa |
| 6,420,204 B2 | 7/2002 | Glenn |
| 6,441,453 B1 | 8/2002 | Tindle |
| 6,483,652 B2 | 11/2002 | Nakamura |
| 6,503,780 B1 | 1/2003 | Glenn et al. |
| 6,531,341 B1 | 3/2003 | Peterson et al. |
| 6,541,762 B2 | 4/2003 | Knag et al. |
| 6,560,047 B2 | 5/2003 | Choi et al. |
| 6,566,745 B1 | 5/2003 | Beyne et al. |
| 6,603,183 B1 | 8/2003 | Hoffman |
| 6,617,623 B2 | 9/2003 | Rhodes |
| 6,661,047 B2 | 12/2003 | Rhodes |
| 6,667,551 B2 | 12/2003 | Hanaoka et al. |
| 6,670,986 B1 | 12/2003 | Ben Shoshan et al. |
| 6,686,588 B1 | 2/2004 | Webster et al. |
| 6,703,310 B2 | 3/2004 | Mashino et al. |
| 6,709,898 B1 | 3/2004 | Ma et al. |
| 6,864,172 B2 | 4/2004 | Noma et al. |
| 6,734,419 B1 | 5/2004 | Glenn et al. |
| 6,759,266 B1 | 7/2004 | Hoffman |
| 6,767,753 B2 | 7/2004 | Huang |
| 6,774,486 B2 | 8/2004 | Kinsman |
| 6,778,046 B2 | 8/2004 | Stafford et al. |
| 6,791,076 B2 | 9/2004 | Webster |
| 6,794,223 B2 | 9/2004 | Ma et al. |
| 6,795,120 B2 | 9/2004 | Takagi et al. |
| 6,797,616 B2 | 9/2004 | Kinsman |
| 6,800,943 B2 | 10/2004 | Adachi |
| 6,813,154 B2 | 11/2004 | Diaz et al. |
| 6,825,458 B1 | 11/2004 | Moess et al. |
| 6,828,663 B2 | 12/2004 | Chen et al. |
| 6,828,674 B2 | 12/2004 | Karpman |
| 6,844,978 B2 | 1/2005 | Harden et al. |
| 6,882,021 B2 | 4/2005 | Boon et al. |
| 6,885,107 B2 | 4/2005 | Kinsman |
| 6,934,065 B2 | 8/2005 | Kinsman |
| 6,946,325 B2 | 9/2005 | Yean et al. |
| 7,091,571 B1 | 8/2006 | Park et al. |
| 7,122,390 B2 | 10/2006 | Kinsman |
| 7,321,455 B2 * | 1/2008 | Kinsman .................... 359/245 |
| 2002/0006687 A1 | 1/2002 | Lam |
| 2002/0057468 A1 | 5/2002 | Segawa et al. |
| 2002/0089025 A1 | 7/2002 | Chou |
| 2002/0096729 A1 | 7/2002 | Tu et al. |
| 2002/0113296 A1 | 8/2002 | Cho et al. |
| 2002/0145676 A1 | 10/2002 | Kuno et al. |
| 2003/0062601 A1 | 4/2003 | Harnden et al. |
| 2004/0012698 A1 | 1/2004 | Suda et al. |
| 2004/0023469 A1 | 2/2004 | Suda |
| 2004/0038442 A1 | 2/2004 | Kinsman |
| 2004/0041261 A1 | 3/2004 | Kinsman |
| 2004/0082094 A1 | 4/2004 | Yamamoto |
| 2004/0178495 A1 | 9/2004 | Yean et al. |
| 2004/0197954 A1 | 10/2004 | Moden |
| 2004/0214373 A1 | 10/2004 | Jiang et al. |
| 2004/0238909 A1 | 12/2004 | Boon et al. |
| 2004/0245649 A1 | 12/2004 | Imaoka |
| 2005/0004560 A1 | 1/2005 | Farnworth et al. |
| 2005/0052751 A1 | 3/2005 | Liu et al. |
| 2005/0063033 A1 | 3/2005 | Kinsman |
| 2005/0104228 A1 | 5/2005 | Rigg et al. |
| 2005/0110889 A1 | 5/2005 | Tuttle et al. |
| 2005/0127478 A1 | 6/2005 | Hiatt et al. |
| 2005/0151228 A1 | 7/2005 | Tanida et al. |
| 2005/0151272 A1 | 7/2005 | Street et al. |
| 2005/0184219 A1 | 8/2005 | Kirby |
| 2005/0231626 A1 | 10/2005 | Tuttle et al. |
| 2005/0236708 A1 | 10/2005 | Farnworth et al. |
| 2005/0253213 A1 | 11/2005 | Jiang et al. |
| 2005/0254133 A1 | 11/2005 | Akram et al. |
| 2005/0255628 A1 | 11/2005 | Kinsman |
| 2005/0270651 A1 | 12/2005 | Boettiger et al. |
| 2005/0275048 A1 | 12/2005 | Farnworth et al. |
| 2005/0275049 A1 | 12/2005 | Kirby et al. |
| 2005/0275750 A1 | 12/2005 | Akram et al. |
| 2005/0285154 A1 | 12/2005 | Akram et al. |
| 2005/0287783 A1 | 12/2005 | Kirby et al. |

FOREIGN PATENT DOCUMENTS

| | | |
|---|---|---|
| EP | 1 157 967 A2 | 11/2001 |
| FR | 2 835 654 A1 | 8/2003 |
| JP | 59-101882 A | 6/1984 |
| JP | 59-191388 | 10/1984 |
| JP | 07-263607 A | 10/1995 |
| JP | 2001-077496 A | 3/2001 |
| WO | WO-90/05424 A1 | 5/1990 |
| WO | WO-02/075815 A1 | 9/2002 |
| WO | WO-02/095796 A2 | 11/2002 |
| WO | WO-2004/054001 A2 | 6/2004 |

OTHER PUBLICATIONS

U.S. Appl. No. 10/901,851, filed Jul. 28, 2004, Derderian et al.
U.S. Appl. No. 10/893,022, filed Jul. 16, 2004, Hall et al.
U.S. Appl. No. 10/785,466, Kirby.
U.S. Appl. No. 10/845,304, Jiang et al.
U.S. Appl. No. 10/857,948, Boettiger et al.
U.S. Appl. No. 10/863,994, Akram et al.
U.S. Appl. No. 10/864,974, Kirby et al.
U.S. Appl. No. 10/867,352, Farnworth et al.
U.S. Appl. No. 10/867,505, Farnworth et al.
U.S. Appl. No. 10/879,398, Akram et al.
U.S. Appl. No. 10/879,838, Kirby et al.
U.S. Appl. No. 10/894,262, Farnworth et al.
U.S. Appl. No. 10/910,491, Bolken et al.
U.S. Appl. No. 10/919,604, Farnworth et al.
U.S. Appl. No. 10/922,177, Oliver et al.
U.S. Appl. No. 10/922,192, Farnworth.
U.S. Appl. No. 10/925,406, Oliver.
U.S. Appl. No. 10/925,501, Oliver.
U.S. Appl. No. 10/925,502, Watkins et al.

U.S. Appl. No. 10/927,760, Chong et al.
U.S. Appl. No. 10/928,598, Kirby.
U.S. Appl. No. 10/932,296, Oliver et al.
U.S. Appl. No. 11/027,443, Kirby.
U.S. Appl. No. 11/054,692, Boemler.
U.S. Appl. No. 11/056,211, Hembree et al.
U.S. Appl. No. 11/056,484, Boettinger et al.
U.S. Appl. No. 11/061,034, Boettinger.
U.S. Appl. No. 11/146,783, Tuttle et al.
U.S. Appl. No. 11/169,546, Sulfridge.
U.S. Appl. No. 11/169,838, Sulfridge.
U.S. Appl. No. 11/177,905, Akram.
U.S. Appl. No. 11/209,524, Akram.
U.S. Appl. No. 11/217,169, Hiatt et al.
U.S. Appl. No. 11/217,877, Oliver et al.
U.S. Appl. No. 11/218,126, Farnworth et al.
U.S. Appl. No. 11/218,243, Kirby et al.
Austin, M.D. and S.Y. Chou, "Fabrication of 70 nm channel length polymer organic thin-film transistors using nanoimprint lithography." Applied Physics Letters, vol. 81, No. 23, pp. 4431-4433, Dec. 2, 2002, American Institute of Physics.
Brubaker, C. et al., "Ultra-thick Lithography for Advanced Packaging and MEMS," SPIE's 27th Annual International Symposium on Microlithogrpahy 2002, Mar. 3-8, 2002, Santa Clara, CA.
DuPont Electronic Materials, Data Sheet, Pyralux PC 2000 Flexible Composites, 4 pages, Oct. 1998, http://www.dupont.com/fcm.
MicroChem, Nano Su-8, Negative Tone Photoresist Formulations 50-100, 4 pages, Feb. 2002, http://www.microchem.com/products.pdf/SUB_50-100.pdf.
Aachboun, S. and Ranson, P., "Cryogenic etching of deep narrow trenches in silicon," J. Vac. Sci. Technol. A. 18(4), Jul./Aug. 2000, pp. 1848-1852.
Aachboun, S. and Ranson, P., "Deep anisotropic etching of silicon," J. Vac. Sci. Technol. A 17(4), Jul./Aug. 1999, pp. 2270-2273.
Blackburn, J.M. et al., "Deposition of Conformal Copper and Nickel Films from Supercritical Carbon Dioxide," Science, vol. 294, pp. 141-145, Oct. 5, 2001.
Cheng, Yu-T, et al., "Vacuum Packaging Technology Using Localized Aluminum/Silicon-to-Glass Bonding," Journal of Microelectromechanical Systems, vol. 11, No. 5, pp. 556-565, Oct. 2002.
Edmund Industrial Optics, Mounted IR Filters, 1 page retrieved from the Internet on Jun. 30, 2003, http://www.edmundoptics.com.
Hamdorf, M. et al., "Surface-rheological measurements on glass forming polymers based on the surface tension driven decay of imprinted corrugation gratings," Journal of Chemical Physics, vol. 112, No. 9, pp. 4262-4270, Mar. 1, 2000, American Institute of Physics.
Hirafune, S. et al., "Packaging Technology for Imager using Through-hole Interconnection in Si Substrate," Proceeding of HDP'04, IEEE, pp. 303-306, Jul. 2004.
IBM, Zurich Research Laboratory, EPON SU-8 photoresist, 1 page retrieved from the Internet on Jan. 21, 2003, ,http://www.zurich.ibm.com/st/mems/sub8.html>.
Intrinsic Viscosity and Its Relation to Intrinsic Conductivity, 9 pages, retrieved from the Internet on Oct. 30, 2003, </http://www.ciks.cbt.nist.gov/~garbocz/paper58/node3.html>.
King, B. et al., Optomec, Inc., M3D™ Technology, Maskless Mesoscale™ Materials Deposition, 5 pages, http://www.optomec.com/downloads/M3D%20White%Paper%20080502.pdf, retrieved from the Internet on Jun. 17, 2005.
Kingpak Technology, Inc. "CMOS Image Sensor Packaging," 1 page, retrieved from the Internet on Aug. 26, 2003, http://www.kingpak.com/CMOSImager.html.
Kramer, S.J. et al., "Annual Report—Applications of Supercritical Fluid Technology to Semiconductor Device Processing," pp. 1-29, Nov. 2001.
Kyocera Corporation, Memory Package, 1 page, retrieved from the Internet on Dec. 3, 2004, http://global.kyocera.com/prdct/semiconduc/ic_pkg/memory_p.html>.
Lin, Tim (Zhigang) and Rick Yoon, "One Package Technique of Exposed MEMS Sensors," pp. 105-108, 2002 International Symposium on Microelectronics, Sep. 2002.
Ma, X, et al., "Low Temperature Bonding for Wafer Scale Packaging and Assembly of Micromachined Sensors," Final Report 1998-1999 for Micro Project 98-144, 3 pages, Department of Electrical and Computer Engineering, University of California, Davis.
Optomec, M3D™ Technology, Maskless Mesoscale Materials Deposition (M3D), 1 page, http:www.optomec.com/html/m3d.htm>, retrieved from the Internet on Aug. 15, 2003.
Optomec, Inc. M3D™, Maskless Mesoscale™ Materials Deposition, 2 pages, http://www.optomec.com/downloads/M3DSheet.pdf, retrieved from the Internet on Jun. 17, 2005.
Photo Vision Systems, Inc., "Advances in Digital Image Sensors," 22 pages, First Annual New York State Conference on Microelectronic Design, Jan. 12, 2002.
Shan, X-J. et al., "Microplastic embossing process: experimental and theoretical characterization," Sensors and Actuators, A97, 98 (2002) pp. 428-433, Elsevier Science B.V.
Tapes II International Tape and Fabrication Company, Electronics and Electrical Tapes, 2 pages, 2003, http://www.tapes2.com/electronics.htm.
TransChip, Inc., 1 page, retrieved from the Internet on Aug. 26, 2003, http://www.missionventures.com/portfolio/companies/transchip.html.
TransChip, Inc., CMOS vs. CCD, 3 pages, retrieved from the Internet on Dec. 14, 2005, http://www.transchip.com/content.aspx?id=127>.
TransChip, Inc., Technology, 3 pages, retrieved from the Internet on Dec. 14, 2005, http://www.transchip.com/content.aspx?id=10.
Walker, M. J., "Comparison of Bosch and cryogenic processes for patterning high aspect ratio features in silicon," 11 pages, Proc. SPIE vol. 4407, p. 89-99, MEMS Design, Fabrication, Characterization, and Packaging, Uwe F. Behringer, Deepak g. Uttamchandani; Eds., Apr. 2001.
UCI Integrated Nanosystems Research Facility, "Cleaning procedures for glass substrates," 3 pages, Fall 1999.
UCI Integrated Nanosystems Research Facility, "Glass Etch Wet Process," 3 pages, Summer 2000.
Xsil, Via Applications, 1 page, <http://www.xsil.com/viaapplications/index.htm., retrieved from the Internet on Jul. 22, 2003.
Xsil, Vias for 3D Packaging, 1 page, http://www.xsil.comviaapplications/3dpackaging/index.htm>, retrieved from the Internet on Jul. 22, 2003.
Ye, X. R., et al., "Immersion Deposition of Metal Films on Silicon and Germanium Substrates in Supercritical Carbon Dioxide," Chem. Mater. 2003, 15, 83-91.
Yoshida, J., "TransChip rolls out in a single-chip CMOS imager," 3 pages, EE Times, Jul. 18, 2003.

* cited by examiner

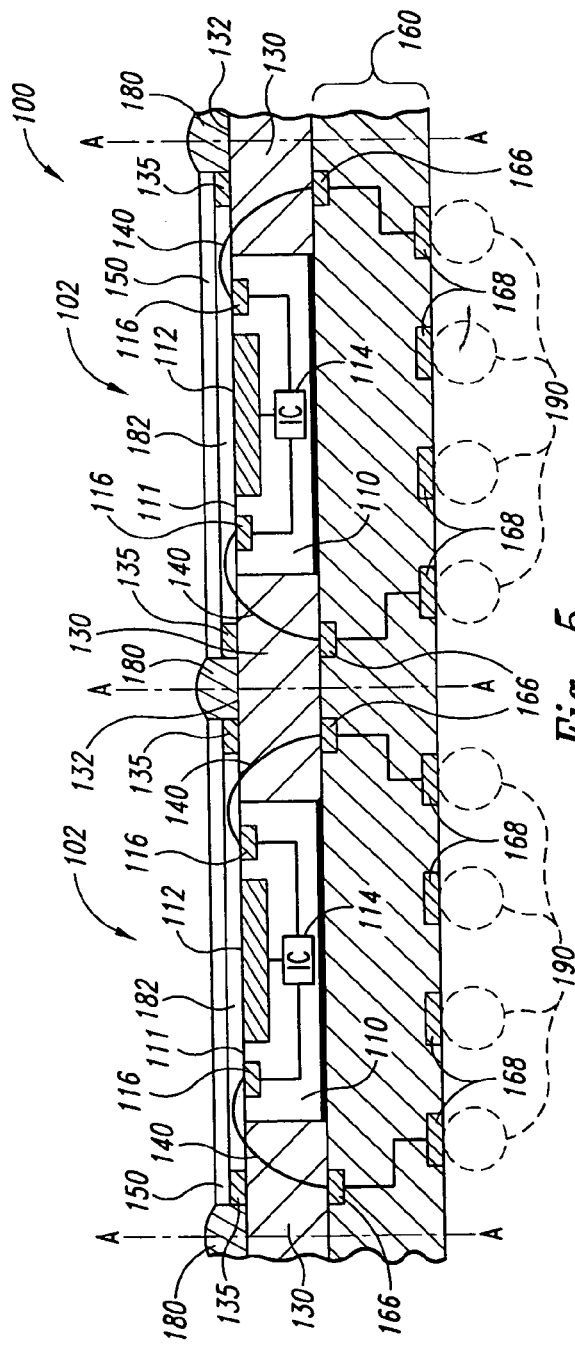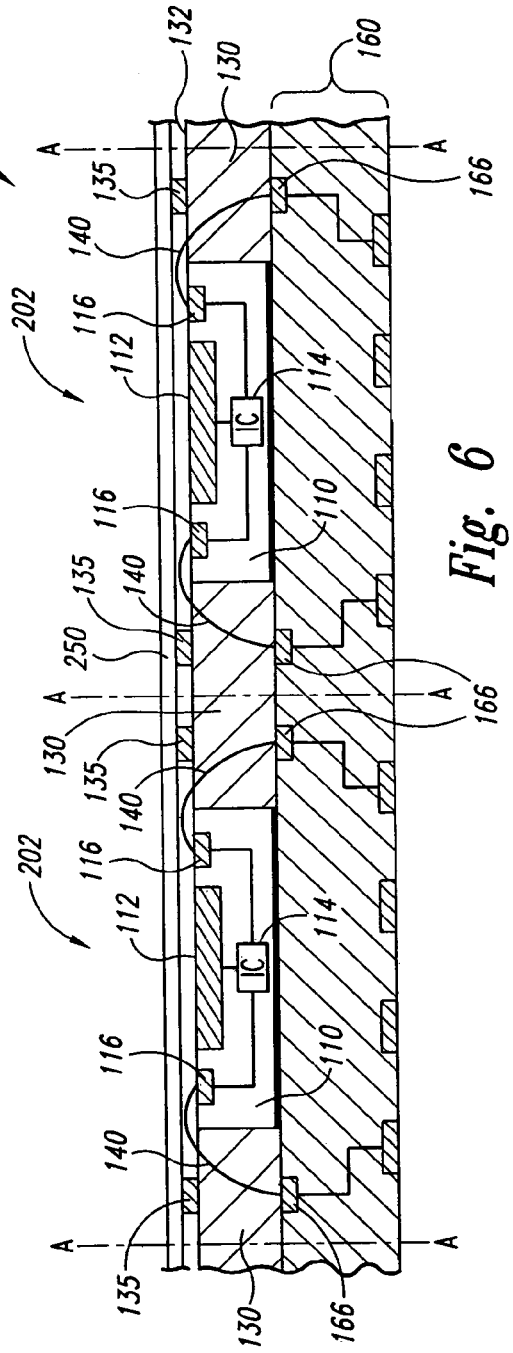

US 7,498,606 B2

MICROELECTRONIC IMAGING UNITS AND METHODS OF MANUFACTURING MICROELECTRONIC IMAGING UNITS

CROSS REFERENCE TO RELATED APPLICATIONS

This is a divisional application of U.S. patent application Ser. No. 10/915,180 filed Aug. 10, 2004 now U.S. Pat. No. 7,364,934, the entirety of which is incorporated herein by reference.

TECHNICAL FIELD

The present invention is related to microelectronic imaging units having solid state image sensors and methods for manufacturing such imaging units.

BACKGROUND

Microelectronic imagers are used in digital cameras, wireless devices with picture capabilities, and many other applications. Cell phones and Personal Digital Assistants (PDAs), for example, are incorporating microelectronic imagers for capturing and sending pictures. The growth rate of microelectronic imagers has been steadily increasing as they become smaller and produce better images with higher pixel counts.

Microelectronic imagers include image sensors that use Charged Coupled Device (CCD) systems, Complementary Metal-Oxide Semiconductor (CMOS) systems, or other solid state systems. CCD image sensors have been widely used in digital cameras and other applications. CMOS image sensors are also quickly becoming very popular because they are expected to have low production costs, high yields, and small sizes. CMOS image sensors can provide these advantages because they are manufactured using technology and equipment developed for fabricating semiconductor devices. CMOS image sensors, as well as CCD image sensors, are accordingly "packaged" to protect their delicate components and to provide external electrical contacts.

FIG. 1 is a schematic side cross-sectional view of a conventional microelectronic imaging unit 1 including an imaging die 10, a chip carrier 30 carrying the die 10, and a cover 50 attached to the carrier 30 and positioned over the die 10. The imaging die 10 includes an image sensor 12 and a plurality of bond-pads 16 operably coupled to the image sensor 12. The chip carrier 30 has a base 32, sidewalls 34 projecting from the base 32, and a recess 36 defined by the base 32 and sidewalls 34. The die 10 is accordingly sized to be received within the recess 36 and attached to the base 32. The chip carrier 30 further includes an array of terminals 18 on the base 32, an array of contacts 24 on an external surface 38, and a plurality of traces 22 electrically connecting the terminals 18 to corresponding external contacts 24. The terminals 18 are positioned between the die 10 and the sidewalls 34 so that wire-bonds 20 can electrically couple the terminals 18 to corresponding bond-pads 16 on the die 10.

One problem with the microelectronic imaging unit 1 illustrated in FIG. 1 is that the die 10 must be sized and configured to fit within the recess 36 of the chip carrier 30. Dies having different shapes and/or sizes accordingly require chip carriers configured to house each type of die. As such, manufacturing imaging units with dies having different sizes requires fabricating various configurations of chip carriers and significantly retooling the manufacturing process.

Another problem with conventional microelectronic imaging units is that they have relatively large footprints. For example, the footprint of the imaging unit 1 in FIG. 1 is the surface area of the base 32 of the chip carrier 30, which is significantly larger than the surface area of the die 10. Accordingly, the footprint of conventional microelectronic imaging units can be a limiting factor in the design and marketability of picture cell phones or PDAs because these devices are continually being made smaller in order to be more portable. Therefore, there is a need to provide microelectronic imaging units with smaller footprints.

BRIEF DESCRIPTION OF THE DRAWINGS

FIGS. 2-5 illustrate stages in one embodiment of a method for manufacturing a plurality of microelectronic imaging units in accordance with the invention.

FIG. 2 is a schematic side cross-sectional view of an assembly including a plurality of imaging dies arranged in an array on a support member.

FIG. 3 is a schematic side cross-sectional view of the assembly after wire-bonding the dies to the support member and forming a base between adjacent dies.

FIG. 5 is a schematic side cross-sectional view of the assembly after depositing a fill material between adjacent covers.

FIG. 6 is a schematic side cross-sectional view of an assembly including a plurality of microelectronic imaging units in accordance with another embodiment of the invention.

DETAILED DESCRIPTION

A. Overview

Figure 1:
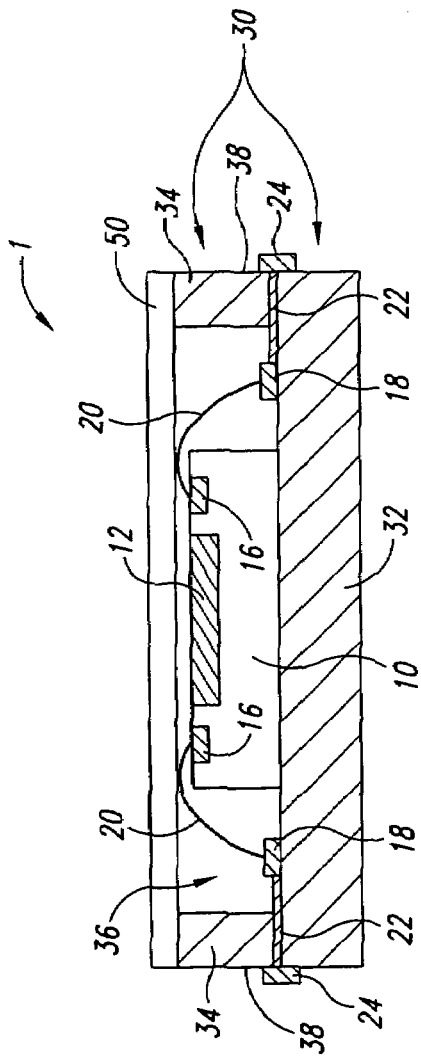
FIG. 1 is a schematic side cross-sectional view of a conventional microelectronic imaging unit in accordance with the prior art.

The following disclosure describes several embodiments of methods for manufacturing microelectronic imaging units and microelectronic imaging units that are formed using such methods. One aspect of the invention is directed toward methods for manufacturing a plurality of microelectronic imaging units. An embodiment of one such method includes placing a plurality of singulated imaging dies on a support member. The individual imaging dies include a first height, an image sensor, -an integrated circuit operably coupled to the image sensor, and a plurality of external contacts operably coupled to the integrated circuit. The method further includes electrically connecting the external contacts of the imaging dies to corresponding terminals on the support member and forming a base on the support member between adjacent imaging dies.

The base has a second height less than or approximately equal to the first height of the dies. The method further includes attaching a plurality of covers to the base so that the covers are positioned over corresponding image sensors.

In another embodiment, a method includes providing a plurality of singulated imaging dies and coupling the singulated imaging dies to a support member. The individual imaging dies include an image sensor, an integrated circuit operably coupled to the image sensor, and a plurality of external contacts operably coupled to the integrated circuit. The method further includes electrically connecting the external contacts of the imaging dies to corresponding terminals on the support member, depositing a flowable material onto the support member to form a base between adjacent imaging dies such that the base contacts at least one end of the individual imaging dies, and attaching a cover to the base with the cover over at least one image sensor.

In another embodiment, a method includes attaching a plurality of singulated imaging dies to a support member, wire-bonding external contacts of the imaging dies to corresponding terminals on the support member, and building a footing on the support member between adjacent imaging dies such that the footing encapsulates a distal portion of the individual wire-bonds proximate to the terminals. The method further includes depositing discrete portions of an adhesive onto the footing and/or a plurality of covers and coupling the covers to the footing so that the covers are positioned over corresponding image sensors.

Another aspect of the invention is directed to microelectronic imaging units. In one embodiment, an assembly of microelectronic imaging units includes a support member having a plurality of terminal arrays and a plurality of imaging dies attached to the support member. The individual imaging dies include an image sensor, an integrated circuit operably coupled to the image sensor, and a plurality of external contacts operably coupled to the integrated circuit and electrically coupled to corresponding terminals on the support member. The assembly further includes a footing on the support member between adjacent imaging dies and a plurality of covers attached to the footing and positioned over corresponding image sensors. The footing is formed with a flowable material that contacts and encapsulates a portion of the individual imaging dies.

In another embodiment, a microelectronic imaging unit includes a support member having an array of terminals, an imaging die projecting a first distance from the support member, and a base projecting a second distance from the support member, with the second distance less than or approximately equal to the first distance. The imaging die includes an image sensor, an integrated circuit operably coupled to the image sensor, and a plurality of external contacts operably coupled to the integrated circuit and electrically coupled to corresponding terminals on the support member. The imaging unit further includes a cover positioned over the image sensor and an adhesive attaching the cover to the base and/or the imaging die.

Specific details of several embodiments of the invention are described below with reference to CMOS imaging units to provide a thorough understanding of these embodiments, but other embodiments can use CCD imaging units or other types of solid state imaging devices. Several details describing structures or processes that are well known and often associated with other types of microelectronic devices are not set forth in the following description for purposes of brevity. Moreover, although the following disclosure sets forth several embodiments of different aspects of the invention, several other embodiments of the invention can have different configurations or different components than those described in this section. As such, it should be understood that the invention may have other embodiments with additional elements or without several of the elements described below with reference to FIGS. 2-10.

B. Embodiments of Methods for Manufacturing Microelectronic Imaging Units

Figure 2:
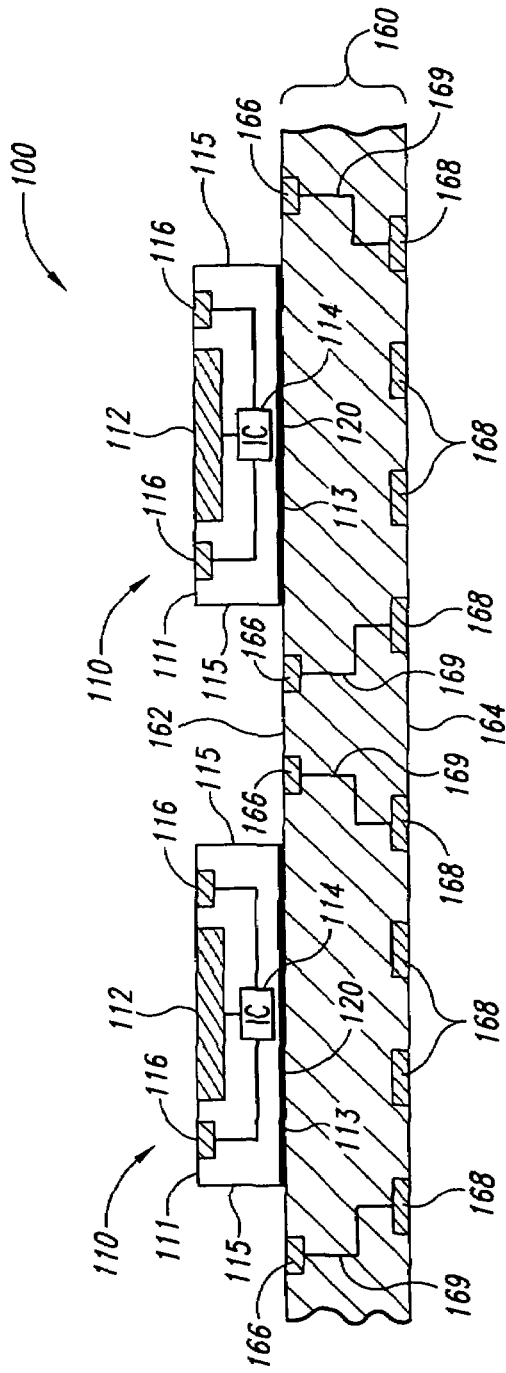

FIGS. 2-5 illustrate stages in one embodiment of a method for manufacturing a plurality of microelectronic imaging units. For example, FIG. 2 is a schematic side cross-sectional view of an assembly 100 including a plurality of microelectronic imaging dies 110 (only two are shown) arranged in an array on a support member 160. The individual imaging dies 110 include a first side 111, a second side 113 opposite the first side 111, and a plurality of ends 115 extending from the first side 111 to the second side 113. The second side 113 of the dies 110 is attached to the support member 160 with an adhesive 120, such as an adhesive film, epoxy, or other suitable material.

The individual imaging dies 110 further include an image sensor 112 on the first side 111, an integrated circuit 114 (shown schematically) operably coupled to the image sensor 112, and a plurality of external contacts 116 (e.g., bond-pads) operably coupled to the integrated circuit 114. The image sensors 112 can be CMOS devices or CCD image sensors for capturing pictures or other images in the visible spectrum. The image sensors 112 may also detect radiation in other spectrums (e.g., IR or UV ranges). In the illustrated embodiment, the imaging dies 110 on the support member 160 have the same structure. However, in several embodiments, the imaging dies on the support member can have different features to perform different functions.

The support member 160 can be a lead frame or a substrate, such as a printed circuit board, for carrying the imaging dies 110 in the illustrated embodiment, the support member 160 includes a first side 162 having a plurality of terminals 166 and a second side 164 having a plurality of pads 168. The terminals 166 can be arranged in arrays for attachment to corresponding external contacts 116 on the dies 110, and the pads 168 can be arranged in arrays for attachment to a plurality of conductive couplers (e.g., solder balls). The support member 160 further includes a plurality of conductive traces 169 electrically coupling the terminals 166 to corresponding pads 168.

Figure 3:
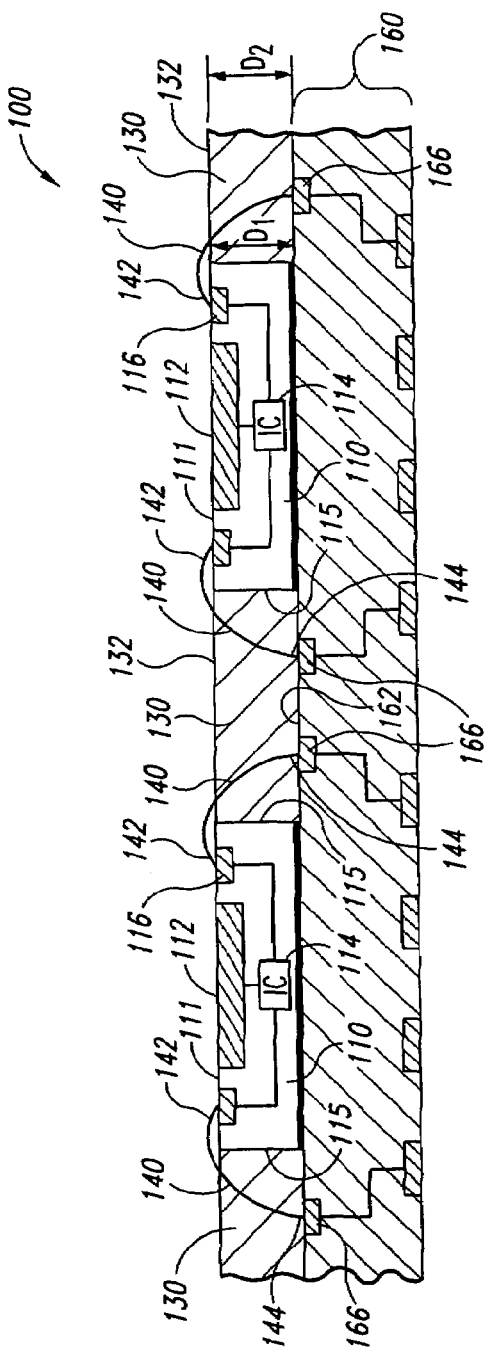

FIG. 3 is a schematic side cross-sectional view of the assembly 100 after wire-bonding the dies 110 to the support member 160 and forming a base 130 between adjacent dies 110. After attaching the imaging dies 110 to the support member 160, the external contacts 116 of the imaging dies 110 are wire-bonded to corresponding terminals 166 on the support member 160. The individual wire-bonds 140 include a proximate portion 142 attached to one of the contacts 116 and a distal portion 144 attached to the corresponding terminal 166. In additional embodiments, the external contacts 116 can be electrically connected to terminals on a support member by conductive through-wafer interconnects. Through-wafer interconnects are described in U.S. patent application Ser. No. 10/713,878, filed on Nov. 13, 2003, which is hereby incorporated by reference.

After wire-bonding the dies 110 to the support member 160, a flowable material is dispensed onto the support member 160 to form a footing or base 130 for supporting a plurality of covers. The flowable material can be an epoxy mold compound or another suitable material to at least partially fill the space between adjacent dies 110. As such, the base 130 contacts at least a portion of the ends 115 of the individual dies 110 and encapsulates at least the distal portion 144 of the individual wire-bonds 140. The flowable material can also be a self-leveling material with a sufficiently low viscosity so that the base 130 has a generally planar support surface 132 to which the covers can be attached. A dam (not shown) can be placed around the perimeter of the support member 160 to inhibit material from flowing off the edge of the member 160 and ensure the flowable material has a generally uniform thickness across the member 160. In several embodiments, however, the base 130 may not have a generally planar support surface across the support member 160.

The volume of flowable material deposited onto the support member 160 is selected so that the base 130 has a predetermined height for supporting covers at a precise distance over the image sensors 112. For example, the imaging dies 110 project a first distance $D_1$ from the support member 160, and the base 130 projects a second distance $D_2$ from the support member 160. In the illustrated embodiment, the first distance $D_1$ is generally equal to the second distance $D_2$. In other embodiments, however, the first distance $D_1$ can be greater than the second distance $D_2$ so that the individual imaging dies 110 project above the support surface 132. In additional embodiments, the second distance $D_2$ can be slightly greater than the first distance $D_1$ provided that the flow material does not encroach upon the image sensors 112.

Figure 4A:
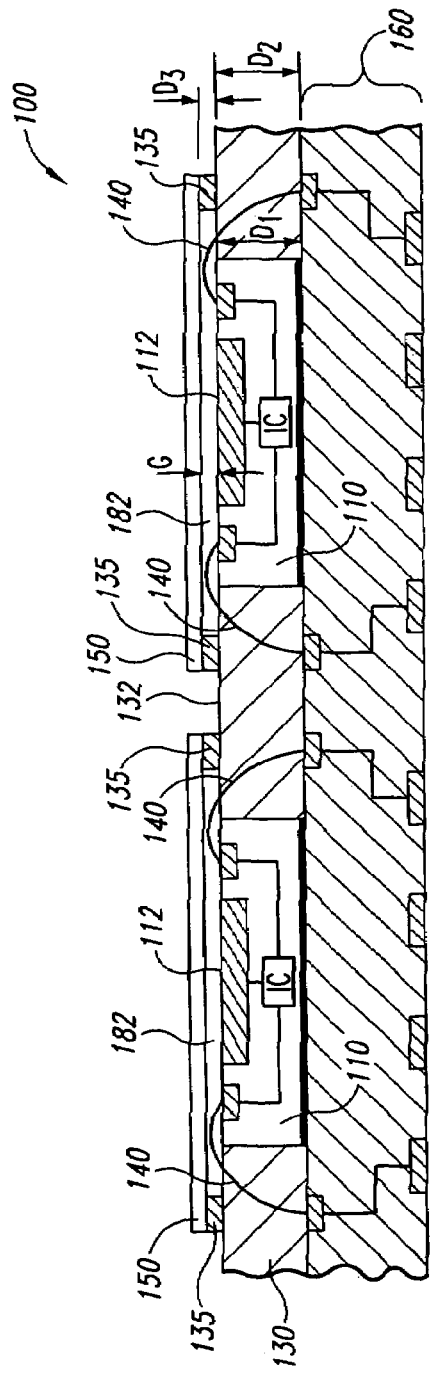
FIG. 4A is a schematic side cross-sectional view of the assembly after depositing discrete portions of an adhesive onto a plurality of covers and/or the base and attaching the covers to the base.

FIG. 4A is a schematic side cross-sectional view of the assembly 100 after (a) depositing discrete portions of an adhesive 135 onto the base 130 and/or a plurality of covers 150 and (b) attaching the covers 150 to the base 130 with the covers 150 positioned over corresponding image sensors 112. The adhesive 135 can be a tape, a flowable material, or another suitable compound for adhering the covers 150 to the base 130. For example, in several embodiments, the adhesive 135 can be a UV- or thermally-curable adhesive that is at least partially cured after the covers 150 are attached. The adhesive 135 has a known thickness $D_3$ so that the covers 150 are spaced apart from the image sensors 112 by a predetermined and precise distance G, which corresponds to the difference between the first distance $D_1$ and the sum of the second distance $D_2$ and the thickness $D_3$. The covers 150 can be glass, quartz, or another suitable material that is transmissive to the desired spectrum of radiation. The covers 150, for example, can further include one or more anti-reflective films and/or filters.

Figure 4B:
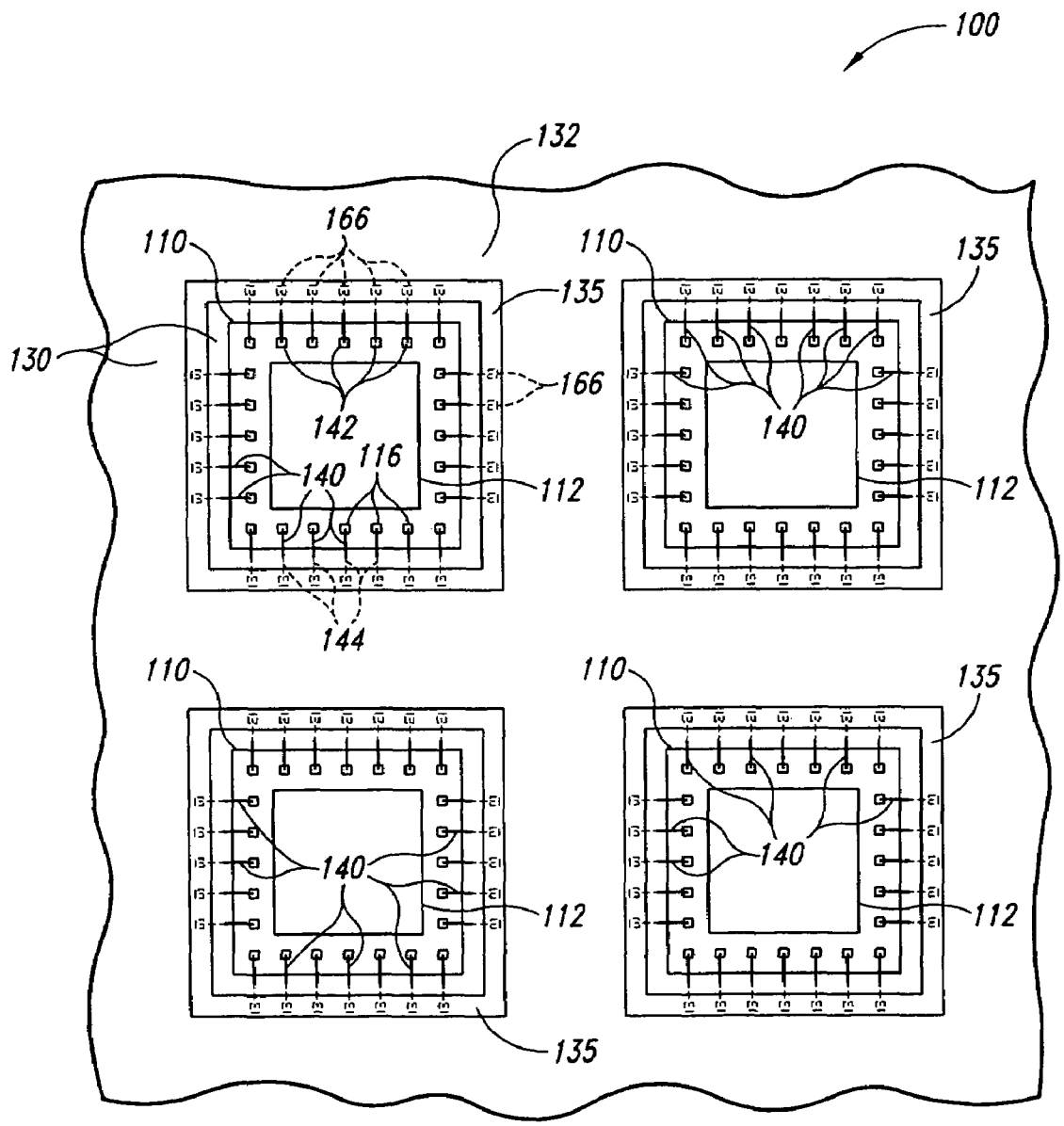
FIG. 4B is a top plan view of a portion of the assembly of FIG. 4A with the covers removed for clarity.

FIG. 4B is a top plan view of a portion of the assembly 100 with the covers 150 removed for clarity. Referring to both FIGS. 4A and 4B, in the illustrated embodiment, the discrete portions of adhesive 135 (a) surround corresponding dies 110 and (b) are positioned outboard the proximal portion 142 of the individual wire-bonds 140 and directly over the terminals 166 of the support member 160 (FIG. 4A). Moreover, the discrete portions of adhesive 135 define a cell 182 (FIG. 4A) between the individual dies 110 and corresponding covers 150. The cells 182 can be filled with gas, such as air, or an underfill material, as described below with reference to FIG. 7. In additional embodiments, such as the embodiments described below with reference to FIGS. 8-10, the discrete portions of adhesive may not completely surround the individual dies 110, and/or the discrete portions of adhesive may be placed at a different position relative to the individual dies 110. For example, the adhesive can be positioned directly over the imaging dies 110 or an interface between the imaging dies 110 and the base 130.

FIG. 5 is a schematic side cross-sectional view of the assembly 100 after depositing a fill material 180 around the perimeter of the individual covers 150. The fill material 180 can be dispensed onto the base 130 via a gap between adjacent covers 150 to encapsulate and cover the ends of the covers 150 and the adhesive 135. As such, the fill material 180 (a) increases the robustness of the assembly 100, (b) enhances the integrity of the joint between the individual covers 150 and the base 130, and (c) protects the image sensors 112 from moisture, chemicals, and other contaminants. The assembly 100 may also include a plurality of conductive couplers 190 (shown in broken lines) on corresponding pads 168 of the support member 160. In several embodiments, however, the assembly 100 may not include the fill material 180 between adjacent covers 150 and/or the conductive couplers 190.

After dispensing the fill material 180, the assembly 100 can be heated to at least partially cure (i.e., B-stage) the fill material 180 and/or the adhesive 135. Alternatively, before the fill material 180 is deposited, the adhesive 135 can be cured by heat, exposure to UV light, or another suitable method depending on the type of adhesive. After curing the fill material 180 and/or the adhesive 135, the assembly 100 can be cut along lines A-A by scribing, sawing, or another suitable process to singulate the individual imaging units 102.

One feature of the imaging units 102 illustrated in FIG. 5 is that the base 130 provides a support surface 132 with a relatively large area on which to place the adhesive 135. An advantage of this feature is that attaching the adhesive 135 to the relatively large support surface 132 is easier than placing the adhesive 135 on the first side 111 of the die 110 because of the difficulty in positioning the adhesive 135 on the die 110 without covering the image sensor 112 and without damaging the wire-bonds 140. As such, the design of the illustrated imaging units 102 reduces the risk of (a) contaminating the image sensor 112 and the external contacts 116 with adhesive material and (b) damaging the wire-bonds 140 while depositing the adhesive 135. Thus, the process of manufacturing the illustrated imaging units 102 is expected to produce fewer imaging units with defects. Moreover, the illustrated imaging units 102 may be manufactured without using expensive and precise alignment equipment to deposit the adhesive 135 and/or attach the covers 150.

Another feature of the imaging units 102 illustrated in FIG. 5 is that the distal portion 144 of the wire-bonds 140 are encased by the base 130 that supports the covers 150. An advantage of this feature is that the footprint of the individual imaging units 102 is smaller than the footprint of conventional imaging units. The reduced footprint of the imaging units 102 is particularly advantageous for picture cell phones, PDAs, or other applications where space is limited. In prior art devices, such as the imaging unit 1 illustrated in FIG. 1, the terminals 18 and the wire-bonds 20 are inboard the sidewalls 34 of the chip carrier 30, which increases the footprint of the imaging unit 1.

One feature of the method for manufacturing imaging units 102 illustrated in FIGS. 2-5 is that the support member 160 can carry imaging dies 110 with different sizes and/or configurations. An advantage of this feature is that the method can be easily adapted to handle various configurations of imaging dies without significant changes to the fabrication process. Prior art methods, such as the method required to form the imaging unit 1 described above with reference to FIG. 1, may require significant retooling because the chip carriers 30 can only carry imaging dies 10 with a certain shape and size.

Another advantage of the method for manufacturing imaging units 102 illustrated in FIGS. 2-5 is that the method is expected to significantly enhance the efficiency of the manufacturing process because a plurality of imaging units 102 can be fabricated simultaneously using highly accurate and efficient processes developed for packaging and manufacturing semiconductor devices. This method of manufacturing imaging units 102 is also expected to enhance the quality and performance of the imaging units 102 because the semiconductor fabrication processes can reliably produce and assemble the various components with a high degree of precision. As such, several embodiments of the method are expected to significantly reduce the cost for assembling microelectronic imaging units 102, increase the performance of the imaging units 102, and produce higher quality imaging units 102.

C. Additional Embodiments of Microelectronic Imaging Units

FIG. 6 is a schematic side cross-sectional view of an assembly 200 including a plurality of microelectronic imaging units 202 in accordance with another embodiment of the invention. The microelectronic imaging units 202 are generally similar to the microelectronic imaging units 102 described above with reference to FIG. 5. The imaging units 202 shown in FIG. 6, however, include a single cover 250 extending over multiple imaging dies 110 that is attached to the base 130 with the adhesive 135. The cover 250 can be glass, quartz, or another suitable material that is transmissive to the desired spectrum of radiation. After attaching the cover 250 to the base 130, the assembly 200 can be cut along lines A-A to singulate the individual imaging units 202.

Figure 7:
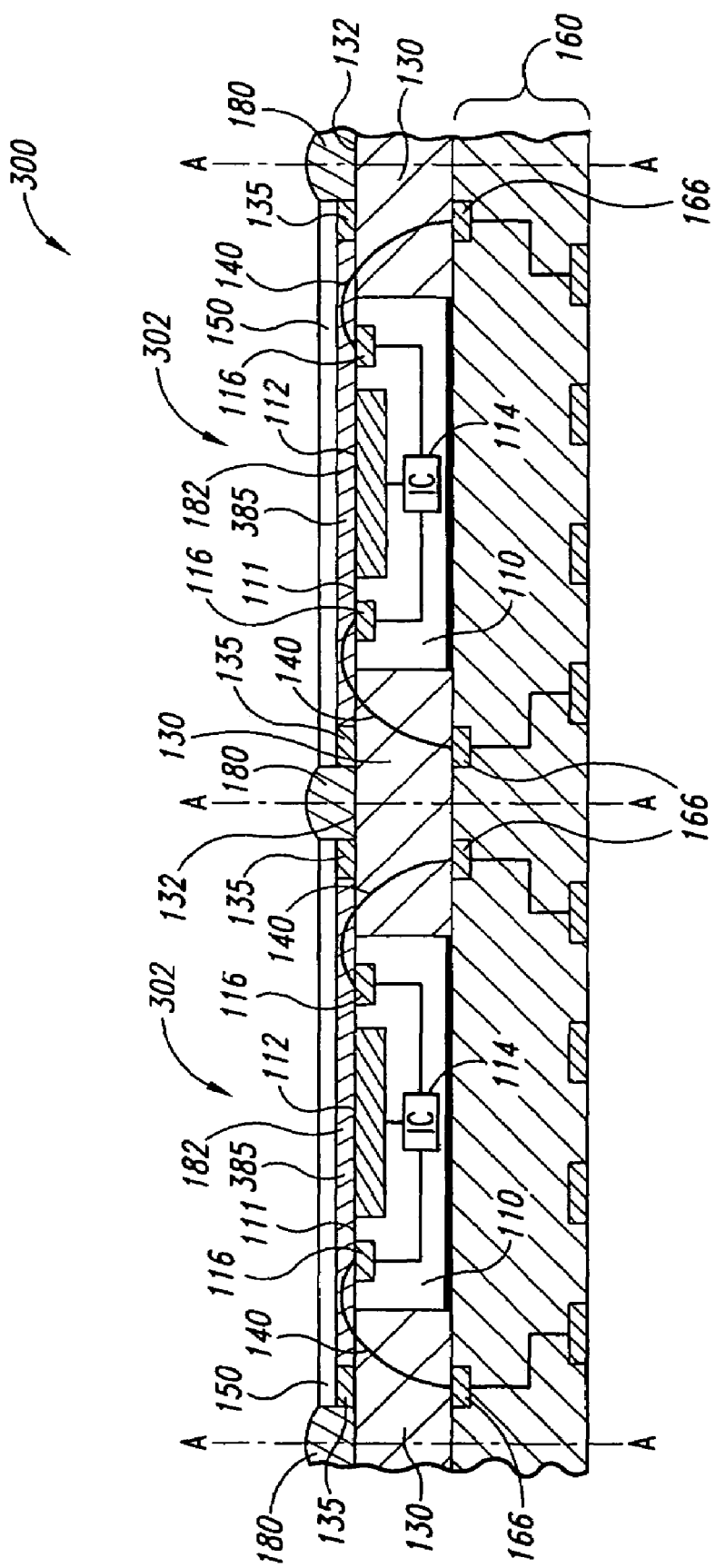
FIG. 7 is a schematic side cross-sectional view of an assembly including a plurality of microelectronic imaging units in accordance with another embodiment of the invention.

FIG. 7 is a schematic side cross-sectional view of an assembly 300 including a plurality of microelectronic imaging units 302 in accordance with another embodiment of the invention. The microelectronic imaging units 302 are generally similar to the microelectronic imaging units 102 described above with reference to FIG. 5. However, unlike the imaging units 102 described above, the imaging units 302 shown in FIG. 7 include an underfill 385 disposed across the first side 111 of the imaging dies 110. As such, the underfill 385 covers the image sensors 112 and fills the cells 182 between the covers 150 and the imaging dies 110. The underfill 385 can be an optical grade material with a high transparency to eliminate or reduce light scattering and/or the loss of images. In applications in which the image sensors 112 have pixels with a smaller size, the underfill 385 can have a higher refractive index to assist in focusing the light for the pixels.

One feature of the imaging units 302 illustrated in FIG. 7 is that the underfill 385 can be a material that is dimensionally stable over a wide range of temperatures. An advantage of this feature is that the distance between the covers 150 and the corresponding image sensors 112 remains generally consistent, even if the imaging units 302 operate in an environment that experiences significant changes in ambient temperature. If the temperature change were to cause the medium between the cover 150 and the image sensor 112 to expand or contract, the associated change in the distance between the cover 150 and the image sensor 112 could skew the images and reduce the life of the imaging unit 302 due to fatigue.

Figure 8:
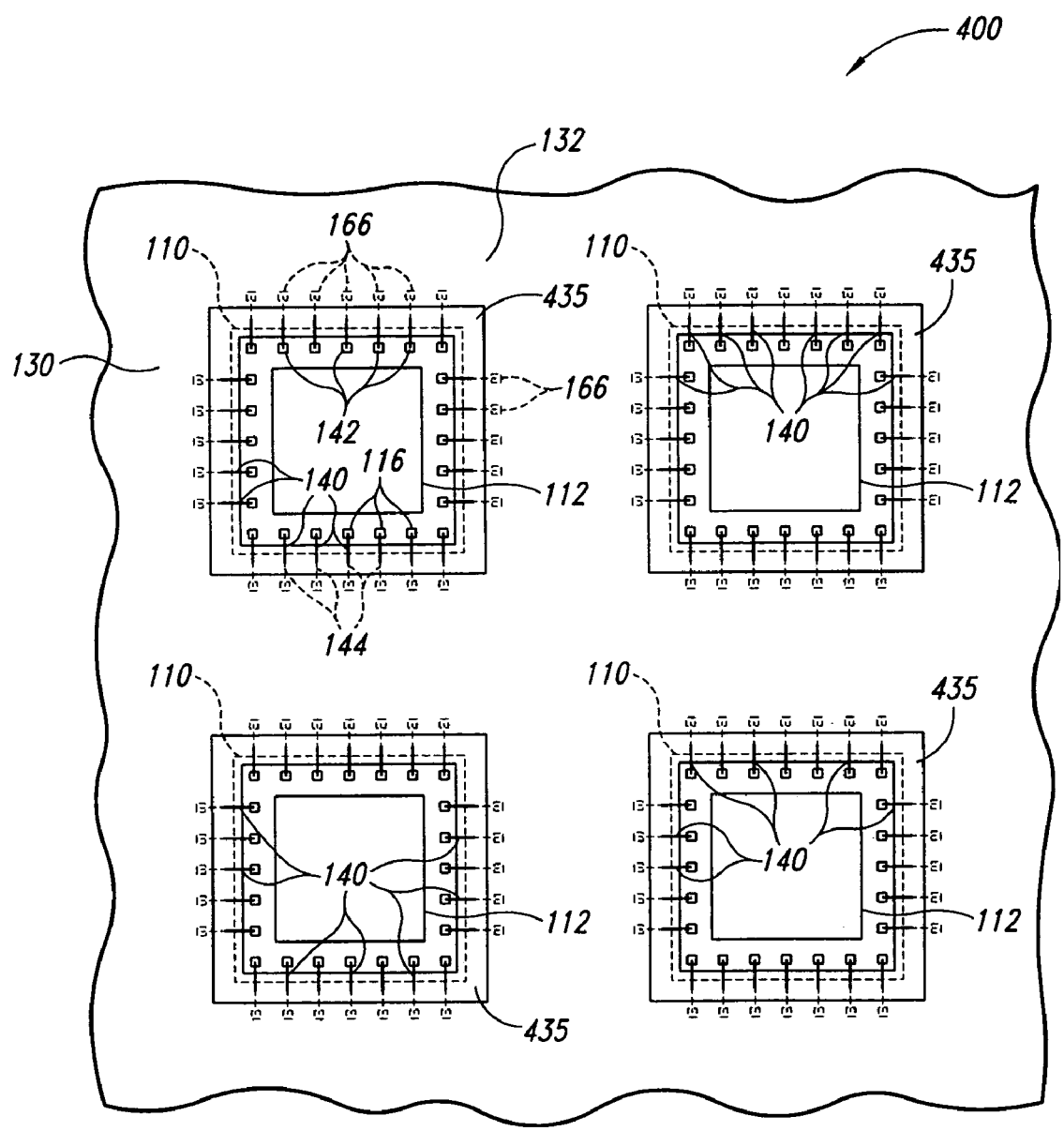
FIG. 8 is a schematic top plan view of an assembly including a plurality of imaging dies attached to a support member in accordance with another embodiment of the invention.
Figure 9:
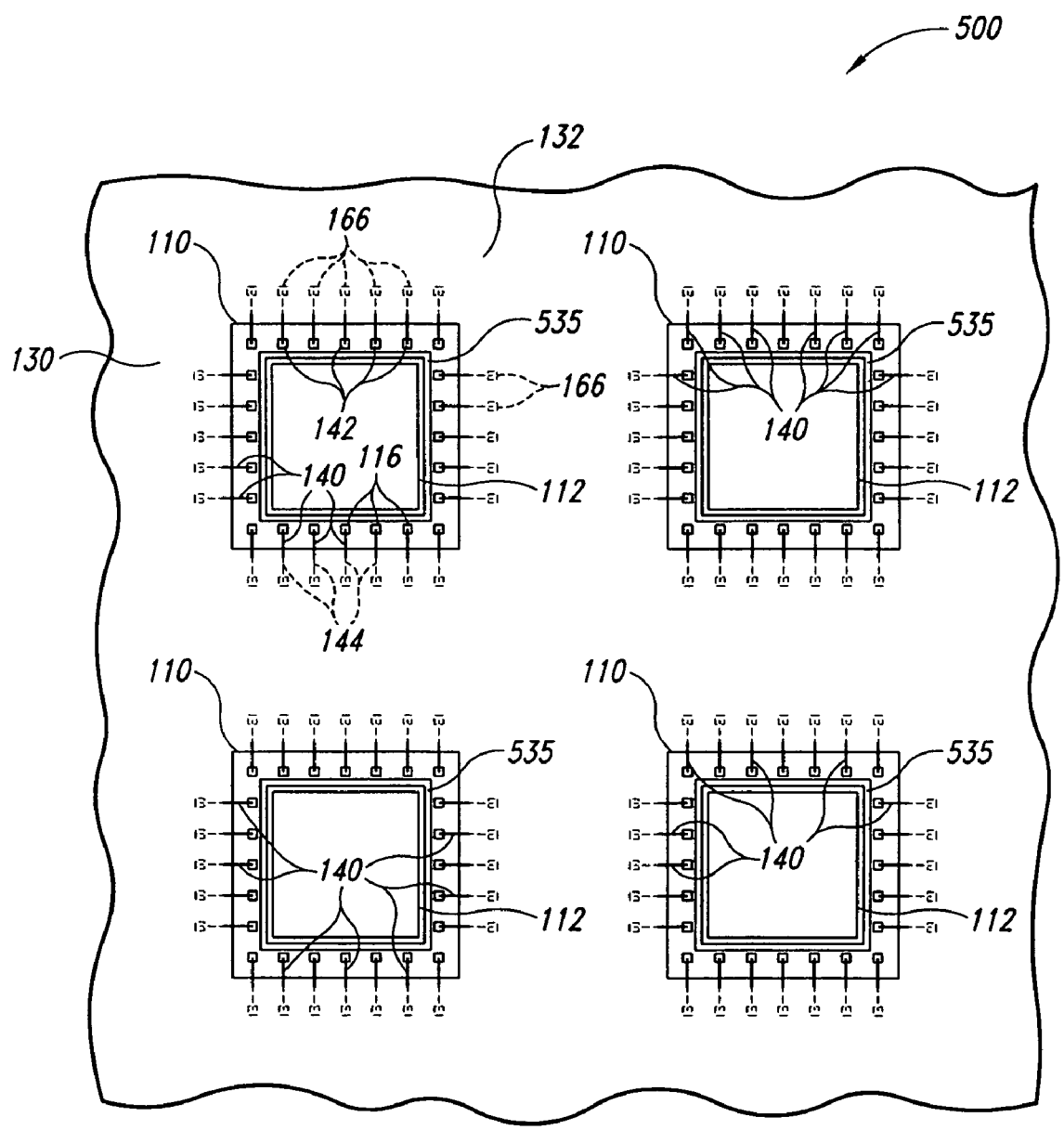
FIG. 9 is a schematic top plan view of an assembly including a plurality of imaging dies attached to a support member in accordance with another embodiment of the invention.
Figure 10:
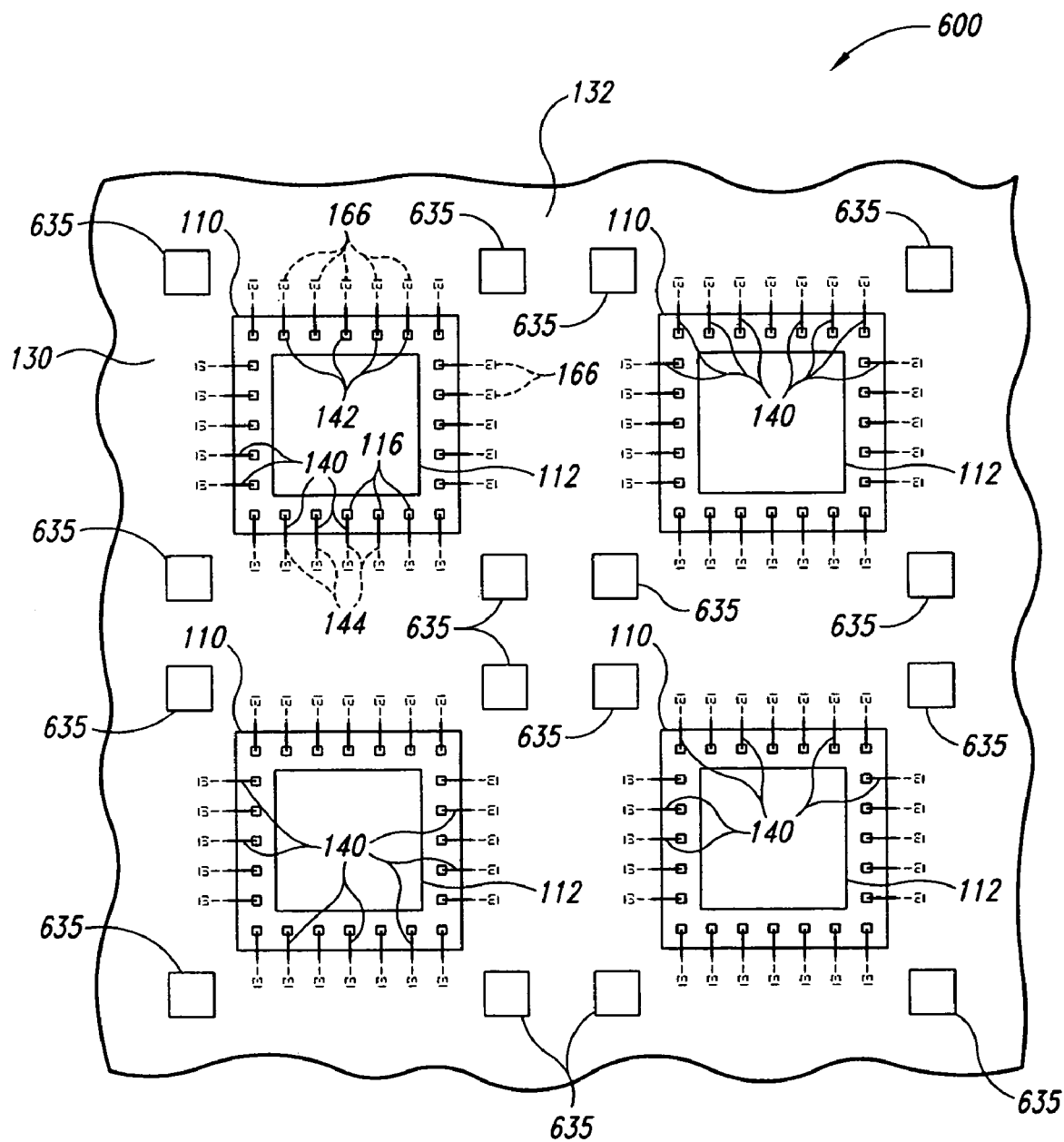
FIG. 10 is a schematic top plan view of an assembly including a plurality of imaging dies attached to a support member in accordance with another embodiment of the invention.

FIGS. 8-10 are schematic top plan views of assemblies having a plurality of microelectronic imaging units in accordance with additional embodiments of the invention. The assemblies illustrated in FIGS. 8-10 are generally similar to the assembly 100 illustrated in FIG. 4B. For example, the assemblies illustrated in FIGS. 8-10 include a plurality of imaging dies 110, a support member (not shown) carrying the dies 110, a base 130 formed between adjacent dies 110, and a plurality of covers (not shown for purposes of clarity) over the image sensors 112. The assemblies illustrated in FIGS. 8-10, however, include discrete portions of an adhesive positioned in different arrangements on the dies 110 and/or the base 130.

In FIG. 8, for example, an assembly 400 includes discrete portions of an adhesive 435 positioned on the imaging dies 110 and the base 130 over an interface between the individual dies 110 and the base 130. As such, the adhesive 435 is positioned inboard the terminals 166 and outboard the external contacts 116 of the imaging dies 110. In FIG. 9, an assembly 500 includes discrete portions of an adhesive 535 positioned on corresponding imaging dies 110 and not on the base 130. More specifically, the adhesive 535 is disposed inboard the external contacts 116 and outboard the image sensor 112. In FIG. 10, an assembly 600 includes discrete portions of an adhesive 635 arranged in arrays relative to corresponding imaging dies 110. The illustrated arrays include four discrete portions of the adhesive 635 on the base 130 positioned proximate to the corners of the individual dies 110. In additional embodiments, the adhesive 635 can have a different number of discrete portions and/or the discrete portions can be arranged differently.

From the foregoing, it will be appreciated that specific embodiments of the invention have been described herein for purposes of illustration, but that various modifications may be made without deviating from the spirit and scope of the invention. For example, the microelectronic imaging units can have any combination of the features described above. Accordingly, the invention is not limited except as by the appended claims.

The invention claimed is:

1. A plurality of microelectronic imaging units, comprising:
a support member;
a plurality of imaging dies attached to the support member, the individual imaging dies comprising a first height, an image sensor, an integrated circuit operably coupled to the image sensor, and a plurality of external contacts operably coupled to the integrated circuit;
a base on the support member between adjacent imaging dies, the base having a second height Less than or approximately equal to the first height of the dies; and
a plurality of covers attached to the base and positioned over corresponding image sensors.

2. The microelectronic imaging units of claim 1 wherein the base comprises a flowable material.

3. The microelectronic imaging units of claim 1 wherein the base contacts a portion of the individual imaging dies.

4. The microelectronic imaging units of claim 1 wherein the support member comprises a plurality of terminal arrays, wherein the imaging units further comprise a plurality of wire-bonds having a proximal end coupled to one of the external contacts and a distal end coupled to a corresponding terminal, and wherein the base encapsulates the distal end of the individual wire-bonds.

5. The microelectronic imaging units of claim 1, further comprising an adhesive between the individual covers and the base.

6. The microelectronic imaging units of claim 1 wherein the base comprises a generally planar support surface to which the covers are attached.

7. The microelectronic imaging units of claim 1, further comprising a fill material on the base and between adjacent covers.

8. A plurality of microelectronic imaging units, comprising:
a support member having a plurality of terminal arrays;
a plurality of imaging dies attached to the support member, the individual imaging dies comprising an image sensor, an integrated circuit operably coupled to the image sensor, and a plurality of external contacts operably coupled to the integrated circuit and electrically coupled to corresponding terminals on the support member;

a footing on the support member between adjacent imaging dies and contacting a portion of the individual imaging dies; and a plurality of covers attached to the footing and positioned over corresponding image sensors, wherein:

the imaging dies project a first distance from the support member; and the footing projects a second distance from the support member, the second distance being less than or approximately equal to the first distance.

9. A plurality of microelectronic imaging units, comprising:

a support member having a plurality of terminal arrays;

a plurality of imaging dies attached to the support member, the individual imaging dies comprising an image sensor, an integrated circuit operably coupled to the image sensor, and a plurality of external contacts operably coupled to the integrated circuit and electrically coupled to corresponding terminals on the support member;

a footing on the support member between adjacent imaging dies and contacting a portion of the individual imaging dies; and a plurality of covers attached to the footing and positioned over corresponding image sensors, wherein the footing comprises a generally planar support surface to which the covers are attached.

10. A microelectronic imaging unit, comprising:

a support member having an array of terminals;

an imaging die projecting a first distance from the support member, the imaging die comprising an image sensor, an integrated circuit operably coupled to the image sensor, and a plurality of external contacts operably coupled to the integrated circuit and electronically coupled to corresponding terminals on the support member;

a base projecting a second distance from the support member, the second distance being less than or approximately equal to the first distance;

a cover positioned over the image sensor; and an adhesive attaching the cover to the base and/or the imaging die.

11. The microelectronic imaging unit of claim 10 wherein the adhesive is attached to the base and the imaging die at an interface between the base and the imaging die.

12. The microelectronic imaging unit of claim 10 wherein the adhesive is attached to the base at a perimeter of the imaging die.

13. The microelectronic imaging unit of claim 10 wherein the adhesive is attached to the base so that the adhesive circumscribes the imaging die.

14. The microelectronic imaging unit of claim 10 wherein the adhesive comprises discrete volumes of adhesive.

15. The microelectronic imaging unit of claim 10 wherein the adhesive is attached to the imaging die between the external contacts and the image sensor.

16. The microelectronic imaging unit of claim 10 wherein the adhesive is attached to the imaging die outboard the external contacts.

17. The microelectronic imaging unit of claim 10 wherein the adhesive has a known thickness to space the cover apart from the image sensor by a desired distance.

18. The microelectronic imaging unit of claim 10 wherein the base comprises a flowable material.

19. The microelectronic imaging unit of claim 10 wherein the base contacts a portion of the imaging die.

20. The microelectronic imaging unit of claim 10, further comprising a plurality of wire-bonds having a proximal end coupled to one of the external contacts and a distal end coupled to a corresponding terminal, wherein the base encapsulates the distal end of the individual wire-bonds.

21. The microelectronic imaging unit of claim 10 wherein the base comprises a generally planar support surface to which the cover is attached.

22. A plurality of microelectronic imaging units, comprising:

a support member having a plurality of terminal arrays;

a plurality of imaging dies attached to the support member, the individual imaging dies comprising an image sensor, an integrated circuit operably coupled to the image sensor, and a plurality of external contacts operably coupled to the integrated circuit;

a plurality of wire-bonds having a proximal portion coupled to one of the external contacts and a distal portion coupled to a corresponding terminal;

a footing on the support member encapsulating the distal portion of the individual wire-bonds;

a plurality of covers positioned over corresponding image sensors; and an adhesive attaching the covers to the footing and/or corresponding imaging dies, wherein the footing comprises a generally planar support surface to which the covers are attached.

23. A plurality of microelectronic imaging units, comprising:

a support member having a plurality of terminal arrays;

a plurality of imaging dies attached to the support member, the individual imaging dies comprising an image sensor, an integrated circuit operably coupled to the image sensor, and a plurality of external contacts operably coupled to the integrated circuit;

a plurality of wire-bonds having a proximal portion coupled to one of the external contacts and a distal portion coupled to a corresponding terminal;

a footing on the support member encapsulating the distal portion of the individual wire-bonds;

a plurality of covers positioned over corresponding image sensors; and an adhesive attaching the covers to the footing and/or corresponding imaging dies, wherein:

the imaging dies project a first distance from the support member; and the footing projects a second distance from the support member, the second distance being less than or approximately equal to the first distance.

24. A plurality of microelectronic imaging units, comprising:

a support member having a plurality of terminal arrays;

a plurality of imaging dies attached to the support member, the individual imaging dies comprising an image sensor, an integrated circuit operably coupled to the image sensor, and a plurality of external contacts operably coupled to the integrated circuit;

a plurality of wire-bonds having a proximal portion coupled to one of the external contacts and a distal portion coupled to a corresponding terminal;

a footing on the support member encapsulating the distal portion of the individual wire-bonds;

a plurality of covers positioned over corresponding image sensors; and an adhesive attaching the covers to the footing and/or corresponding imaging dies, wherein the adhesive is attached to the footing and the imaging dies at an interface between the footing and the individual imaging dies.

25. A plurality of microelectronic imaging units, comprising:

a support member having a plurality of terminal arrays;

a plurality of imaging dies attached to the support member, the individual imaging dies comprising an image sensor, an integrated circuit operably coupled to the image sensor, and a plurality of external contacts operably coupled to the integrated circuit;

a plurality of wire-bonds having a proximal portion coupled to one of the external contacts and a distal portion coupled to a corresponding terminal;

a footing on the support member encapsulating the distal portion of the individual wire-bonds;

a plurality of covers positioned over corresponding image sensors; and an adhesive attaching the covers to the footing and/or corresponding imaging dies, wherein the adhesive is attached to the footing at a perimeter of the individual imaging dies.

* * * * *